(12) United States Patent
Malandruccolo et al.

(10) Patent No.: US 12,348,238 B2
(45) Date of Patent: Jul. 1, 2025

(54) SENSOR ASSEMBLY WITH INTERFACE CIRCUIT VOLTAGE CONTROL

(71) Applicant: Knowles Electronics, LLC, Itasca, IL (US)

(72) Inventors: Vezio Malandruccolo, Rapperswil (CH); Luca Bettini, Zurich (CH)

(73) Assignee: Knowles Electronics, LLC, Itasca, IL (US)

( * ) Notice: Subject to any disclaimer, the term of this patent is extended or adjusted under 35 U.S.C. 154(b) by 205 days.

(21) Appl. No.: 18/144,612

(22) Filed: May 8, 2023

(65) Prior Publication Data

US 2024/0380406 A1    Nov. 14, 2024

(51) Int. Cl.
| H03M 1/00 | (2006.01) |
| H04R 1/04 | (2006.01) |
| H04R 3/00 | (2006.01) |
| H04R 19/04 | (2006.01) |

(52) U.S. Cl.
CPC ............. H03M 1/002 (2013.01); H04R 1/04 (2013.01); H04R 3/00 (2013.01); H04R 19/04 (2013.01); *H04R 2201/003* (2013.01)

(58) Field of Classification Search
CPC .......... H03M 1/002; H04R 1/04; H04R 3/00; H04R 19/04; H04R 2201/003
USPC .......................... 381/111–117, 120, 122, 123
See application file for complete search history.

(56) References Cited

U.S. PATENT DOCUMENTS

| 6,281,829 | B1* | 8/2001 | Amrany | H04L 27/0002 |
| | | | | 341/155 |
| 7,061,987 | B1* | 6/2006 | Tan | H04M 11/062 |
| | | | | 375/260 |
| 9,729,119 | B1* | 8/2017 | Blatz | H03G 3/3084 |
| 9,743,167 | B2 | 8/2017 | Nielsen et al. | |
| 9,831,844 | B2 | 11/2017 | Yurrtas et al. | |
| 10,257,616 | B2 | 4/2019 | Shajaan et al. | |
| 10,499,150 | B2 | 12/2019 | Shajaan et al. | |
| 11,235,970 | B1* | 2/2022 | Ng | B81B 7/008 |
| 11,451,250 | B1* | 9/2022 | Dedic | H03M 1/0624 |
| 2016/0133271 | A1 | 5/2016 | Kuntzman | |
| 2017/0026759 | A1 | 1/2017 | Dai | |
| 2020/0344557 | A1 | 10/2020 | Korishe et al. | |
| 2022/0210590 | A1 | 6/2022 | Malandruccolo et al. | |
| 2022/0210591 | A1 | 6/2022 | Malandruccolo et al. | |
| 2022/0348458 | A1 | 11/2022 | Bharadwaj et al. | |
| 2023/0171549 | A1* | 6/2023 | Carfore | H04R 3/00 |
| | | | | 381/190 |

\* cited by examiner

*Primary Examiner* — Xu Mei
(74) *Attorney, Agent, or Firm* — Hickman Becker Bingham Ledesma LLP; Matthew C. Loppnow

(57) ABSTRACT

A sensor assembly including a transducer and interface circuit with a DSL-controlled input voltage is disclosed. The interface circuit includes a logic circuit configured to generate and provide a pulse width and amplitude modulated (PWAM) signal to an n-bit iDAC coupled to an analog front end (AFE) amplifier or buffer. The PWAM signal is based on an output of a forward signal-path ADC or low-power ADC coupled to the AFE amplifier or buffer, wherein the n-bit iDAC regulates a voltage at the input of the AFE amplifier or buffer based on the PWAM signal.

20 Claims, 6 Drawing Sheets

SENSOR ASSEMBLY WITH INTERFACE CIRCUIT VOLTAGE CONTROL

FIELD OF THE DISCLOSURE

The present disclosure relates generally to sensor assemblies and more particularly to sensor assemblies with electrical interface circuit voltage control and electrical circuits therefor.

BACKGROUND

Sensor assemblies generally comprise a transducer element coupled to an electrical interface circuit that processes or conditions an electrical signal generated by the transducer element. The interface circuit of some sensor assemblies must be properly biased for accurate sensing of the transducer element signal. The input interface of these and other sensors must also have a high input impedance to operate effectively. In prior art FIG. 1, the interface circuit comprises an analog servo-loop (ASL) including a filter that regulates the voltage at the input of an Analog Front-End (AFE) amplifier or buffer. The ASL also controls the low-frequency roll off (LFRO) of the sensor assembly. However the filter capacitor is large and the capacitive load attenuates the input signal, the ASL is a source of noise, and PVT variations associated with back-to-back diodes coupled to the input can cause voltage variations at the interface circuit input. In prior art FIG. 2, a digital servo-loop (DSL) comprising a pulse width and amplitude modulated (PWAM) n-bit IDAC provides improved voltage regulation at the interface circuit input among other benefits compared to the prior art analog servo-loop (ASL). The DSL requires less silicon for lack of a large filter capacitor, reduces capacitive loading and noise, and improves LFRO control. The digital servo-loop makes use of the analog to digital converter (ADC) that is normally used for the quantization of the analog signal in functional mode. But the large current consumption of the ADC is a critical factor in feature-rich applications where "always ON" or very low power (VLP) modes are required. Thus there is an ongoing need for improvements in sensor assemblies and electrical interface circuits therefor.

BRIEF DESCRIPTION OF THE DRAWINGS

The objects, features and advantages of the present disclosure will become more fully apparent upon consideration of the following detailed description and appended claims in conjunction with the accompanying drawings. The drawings depict only representative embodiments and are not considered to limit the scope of the disclosure.

Those of ordinary skill in the art will appreciate that the figures are illustrated for simplicity and clarity and therefore may not be drawn to scale and may not include well-known features, that the order of occurrence of actions or steps may be different than the order described, that the order of occurrence of such actions or steps may be performed concurrently unless specified otherwise, and that the terms and expressions used herein have meanings understood by those of ordinary skill in the art except where a different meaning is specifically attributed to them herein.

DETAILED DESCRIPTION

The disclosure relates generally to sensor assemblies having improved interface voltage control and electrical interface circuits therefor. The sensor assembly can be implemented as a microphone, vibration sensor, accelerometer, or temperature or gas sensor, among others.

Figure 1:
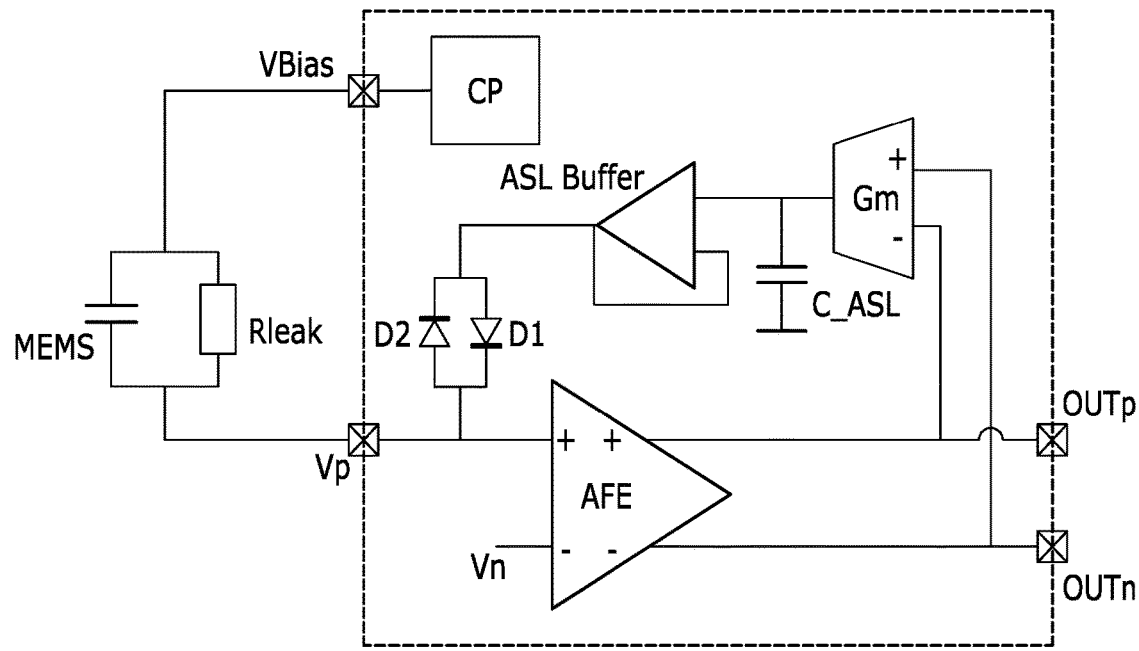
FIG. 1 is a prior art analog sensor assembly comprising an ASL.
Figure 2:
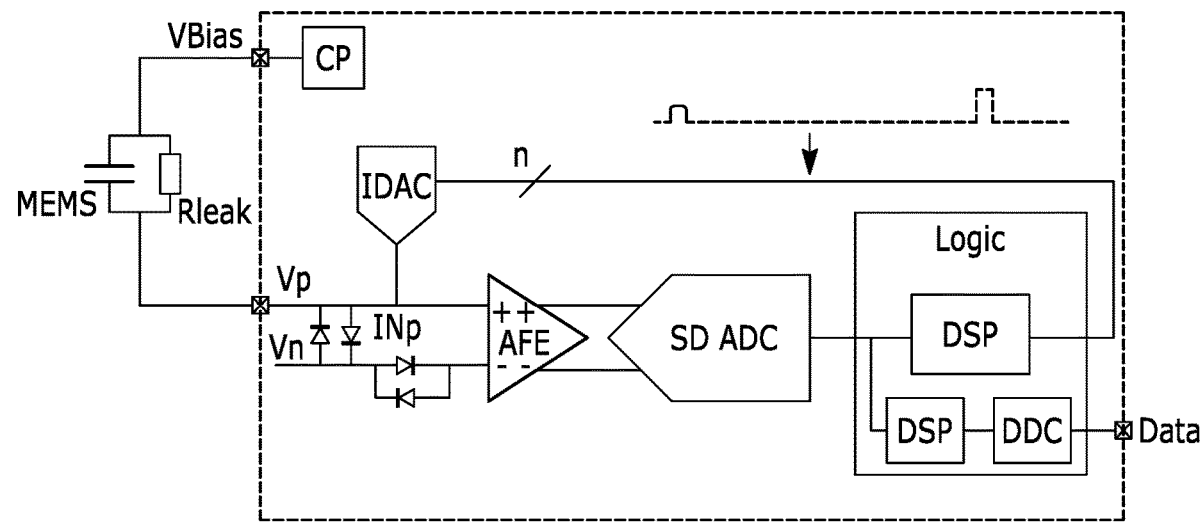
FIG. 2 is a prior art digital sensor assembly comprising a DSL.
Figure 3:
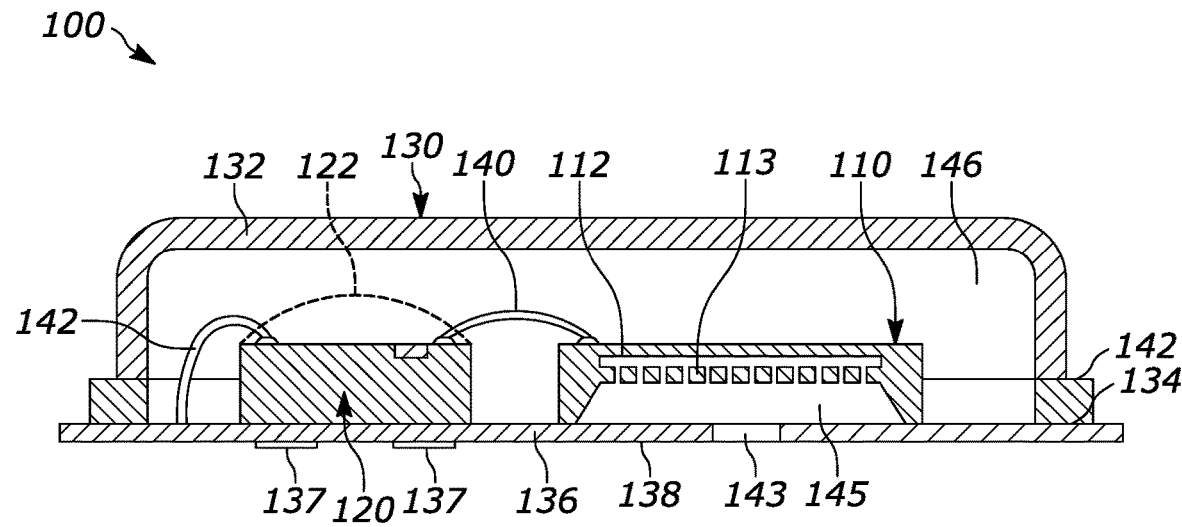
FIG. 3 is a sectional view of a representative sensor assembly.

In FIG. 3, a sensor assembly 100 comprises a transducer element (also referred to herein as a "motor") 110 electrically coupled to an input node of an electrical interface circuit (also referred to herein as an "interface circuit", "electrical circuit" or "circuit") 120 within a housing 130. The representative housing includes a cover 132 fastened to a surface 134 of a base 136. The transducer element and electrical circuit can both be fastened to the base or to the cover, or one to the cover and the other to the base. The housing can shield the transducer element and the electrical circuit located within its interior from external electromagnetic interference, like RF noise. For this purpose, the cover can be a metal can or a non-conductive material, like plastic or FR4, covered by a conductive material electrically coupled to a conductive portion (e.g., a ground plane) of the base. The housing can also include an interface with contacts configured to interface with a host device. Such an interface is also referred to herein as a "host-interface".

The sensor assembly can be configured for mounting to a host device by reflow soldering, pin-grid array or through-hole mounting, among other known and future mounting techniques. The host device can include a PCB or flex PCB to which the sensor assembly is fastened as described herein. In FIG. 3, the sensor assembly is a surface-mount device comprising a host-interface including electrical contacts (e.g., ground, power, data, clock, select . . . ) 137 located on an outer surface 138 of the base 136. The electrical circuit can obtain power, clock, control and other signals via the host-interface contacts, as suggested. The electrical circuit is coupled to the transducer element via one or more leads 140 and to contacts on the host-interface via one or more leads 142 connected to traces (not shown) integrated with the base for this purpose. The electrical circuit can be implemented as an integrated circuit (IC) that can be covered by an encapsulating material 122 to regulate heat dissipation.

In one embodiment, the sensor assembly is a microphone configured to generate an electrical signal representative of acoustic signals, or sounds, propagated through the atmosphere and detected by the transducer element within the housing. In other embodiments, the sensor assembly is a vibration sensor that generates an electrical signal representative of vibrations or forces detected by the transducer element. Such a vibration sensor can detect vibrations propagated through a person's body tissue or through inanimate objects. Other sensor assemblies can detect pressure, acceleration, humidity or temperature, among other conditions. A single sensor assembly can comprise multiple transducer elements to detect corresponding conditions, like sound and vibration, among other combinations. Such multiple transducer elements can be discrete devices or integrated as a unitary device.

In some sensor assemblies, like microphones, the housing includes an aperture (also referred to herein as a "sound port" or "port") connecting the interior of the housing to the external environment. In FIG. 3, the port 143 is located on the base 136 in alignment with the transducer element 110. In top-port sensor assemblies, the port is located on the cover. In other sensor assemblies requiring a port, the port can be located on a sidewall. A port is not required in some sensor assemblies, like acoustic vibration sensors and accelerometers, among others.

In one implementation, the transducer element is a capacitive device. Alternatively, the transducer element can be a piezo, optical or resonant device, among others. The transducer element can be implemented using microelectromechanical systems (MEMS) or some other known or future technology. In FIG. 3, the representative transducer element 110 is a capacitive device comprising a diaphragm 112 spaced apart from, and electrically biased relative to, a perforated back plate 113. Sound pressure entering the housing via sound port 143 displaces the diaphragm resulting in the generation of an electrical signal representative of acoustic pressure variations. The bias voltage can be provided by a charge pump of the electrical circuit. Other transducer elements do not require a bias voltage and thus a charge pump is not required. Other capacitive sensors can have alternative architectural structures.

Figure 4:
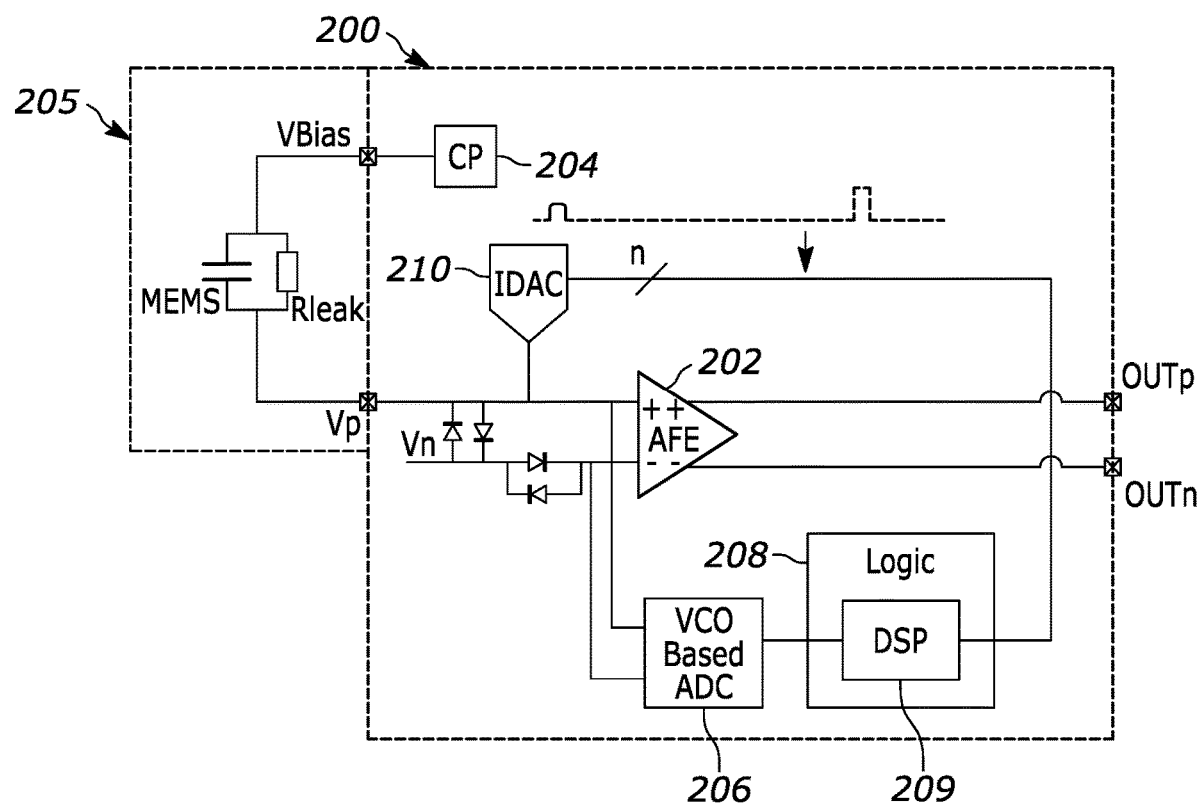
FIG. 4 is a schematic of a representative analog sensor assembly comprising a DSL with a low-power ADC.

The electrical circuit generally comprises an analog front end (AFE) amplifier or buffer in a forward signal-path between input and output nodes or pads of the electrical circuit. The input node of the electrical circuit is connectable to the transducer element when integrated with the sensor assembly. The output node is connectable to the host-interface when the electrical circuit is integrated with the sensor assembly. In FIGS. 4-7, the electrical circuit 200 comprises an AFE amplifier or buffer 202 including differential inputs (+/−) and outputs. Alternatively, the input or output can be single-ended input or output. In FIG. 4, the AFE amplifier or buffer 202 comprises a positive input coupled to the transducer element 205 and a negative input coupled to resistive elements implemented as back-to-back diodes. The differential outputs of the AFE amplifier or buffer are coupled to an output pad ($OUT_P/OUT_N$) of the analog interface circuit.

In FIGS. 4-7, the electrical circuit comprises a charge pump or other bias voltage source 204 coupled to and configured to bias the transducer element. One such transducer element that requires a bias voltage is a capacitive motor. Capacitive motors and other transducer elements may also require that the AFE amplifier or buffer have a high input resistance (e.g., 300 T ohms or more) to prevent or limit charge leakage. Other electrical circuits do not require a bias voltage source or a high input resistance.

In FIGS. 4-7, the transducer element 205 is a single-ended device coupled to the AFE amplifier or buffer 202 of the interface circuit. In one implementation, the transducer element is a pseudo-differential capacitive transducer comprising a single-ended transducer element coupled to one input (+) of a differential AFE amplifier or buffer and a fixed capacitor coupled to another input (−) of the amplifier or buffer. Alternatively, the transducer element can be a differential transducer element coupled to the differential inputs of the AFE amplifier or buffer. The differential transducer can comprise discrete transducers elements or multiple transducer elements integrated in a unitary device.

Generally, the electrical interface circuit also comprises a digital servo-loop (DSL) that regulates the voltage at the input AFE amplifier or buffer. The DSL comprises an n-bit current digital-to-analog converter (iDAC) coupled to the input of the AFE amplifier or buffer. A logic circuit provides pulse width and amplitude modulated (PWAM) signals to the iDAC proportional to an output of an ADC coupled to the AFE amplifier or buffer, as described further herein. For some sensor assemblies, a bandwidth of the DSL can be on the order of 10 Hz and can correspond to a low frequency roll-off (LFRO) of the sensor assembly. For example, the LFRO of a voice sensor is typically less than 3 Hz, but can be more or less depending on the particular use case. The DSL of other types of sensor assemblies can have different bandwidths. Representative examples are described further herein.

In FIG. 4, a representative electrical interface circuit 200 for an analog sensor assembly comprises a DSL configured to regulate the voltage on the input of the AFE amplifier or buffer 202. The DSL comprises an n-bit iDAC 210 coupled to servo-loop logic, e.g., DSP 209, that generates PWAM signals proportional to an output of a low-power ADC 206 coupled to the input of the AFE amplifier or buffer. The iDAC can reduce voltage changes at the interface circuit input by absorbing leakage current from the transducer element. The iDAC can also reduce shot noise in electrical circuit implementations that include back-to-back diodes coupled to the AFE amplifier or buffer. The LFRO can be tuned by controlling gain of the DSL. Compared to prior art analog servo-loops, the DSL of the interface circuit of FIG. 4 regulates the voltage at the input of the AFE amplifier or buffer without the need for a large filter capacitor. The DSL also reduces capacitive loading and noise, and improves LFRO control. Representative low-power ADCs are described further herein.

Figure 5:
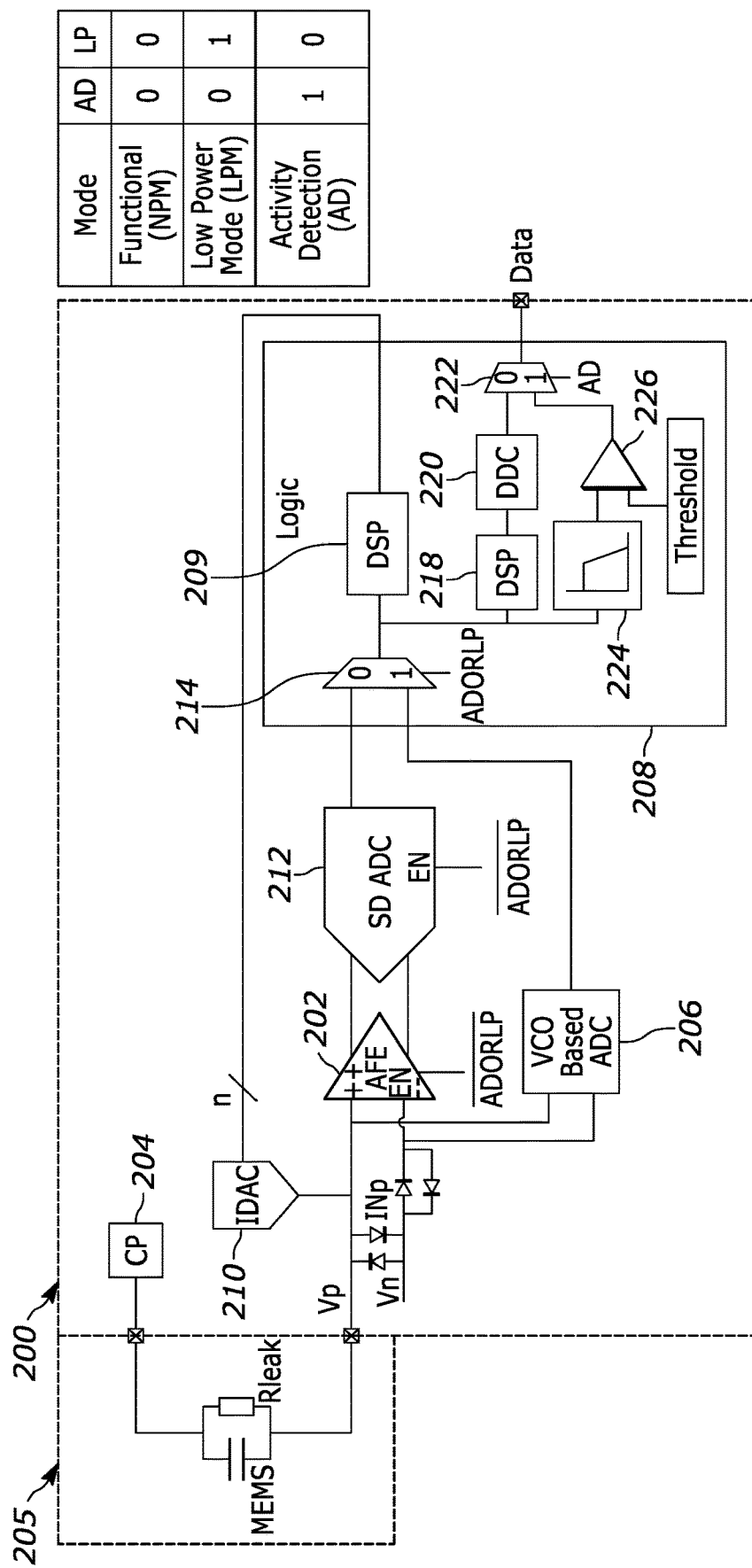
FIG. 5 is a schematic of a representative digital sensor assembly comprising a DSL with a selectable forward signal-path ADC and a low-power (auxiliary) ADC.
Figure 6:
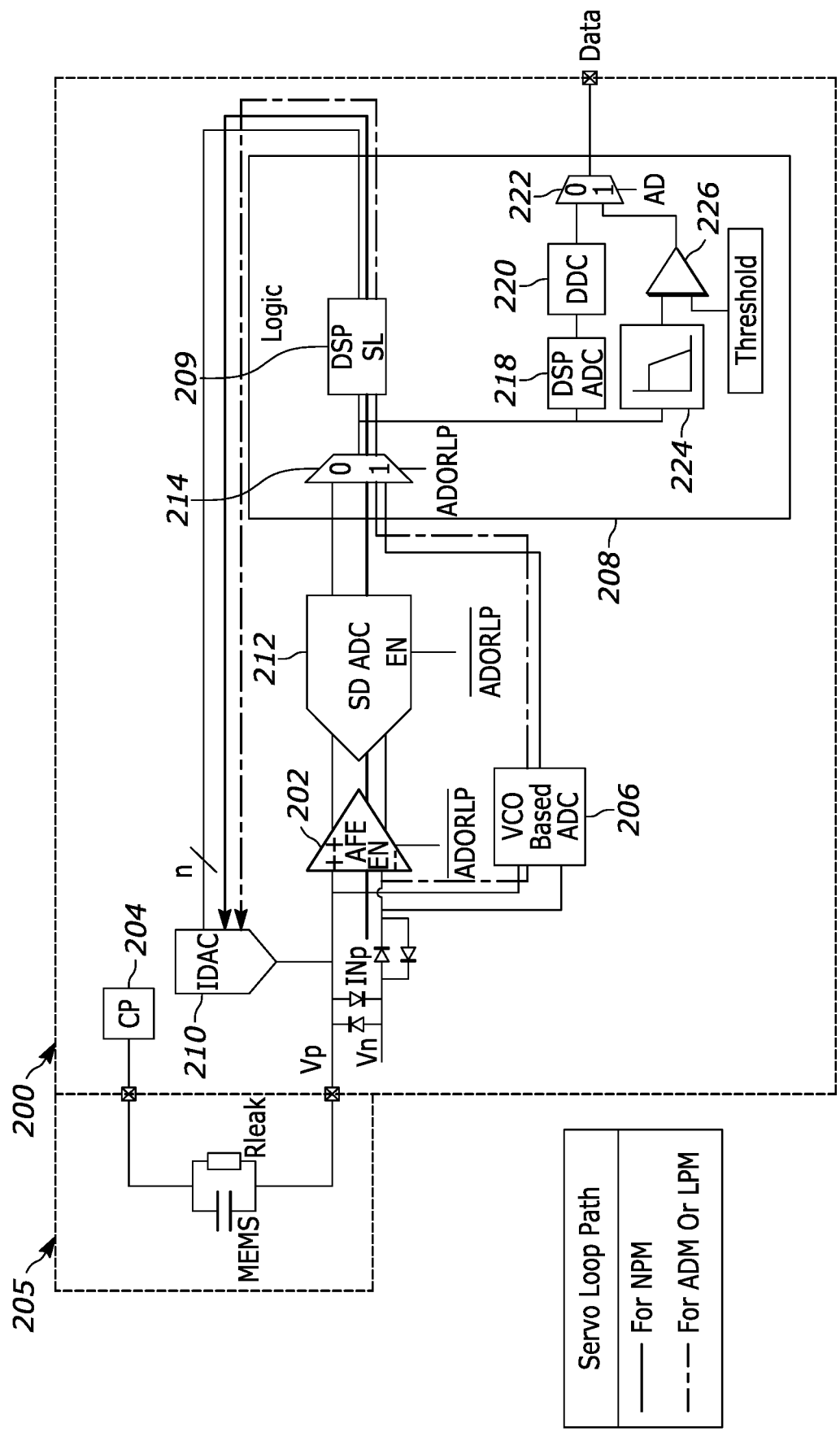
FIG. 6 illustrates operation of the DSL of FIG. 5.
Figure 7:
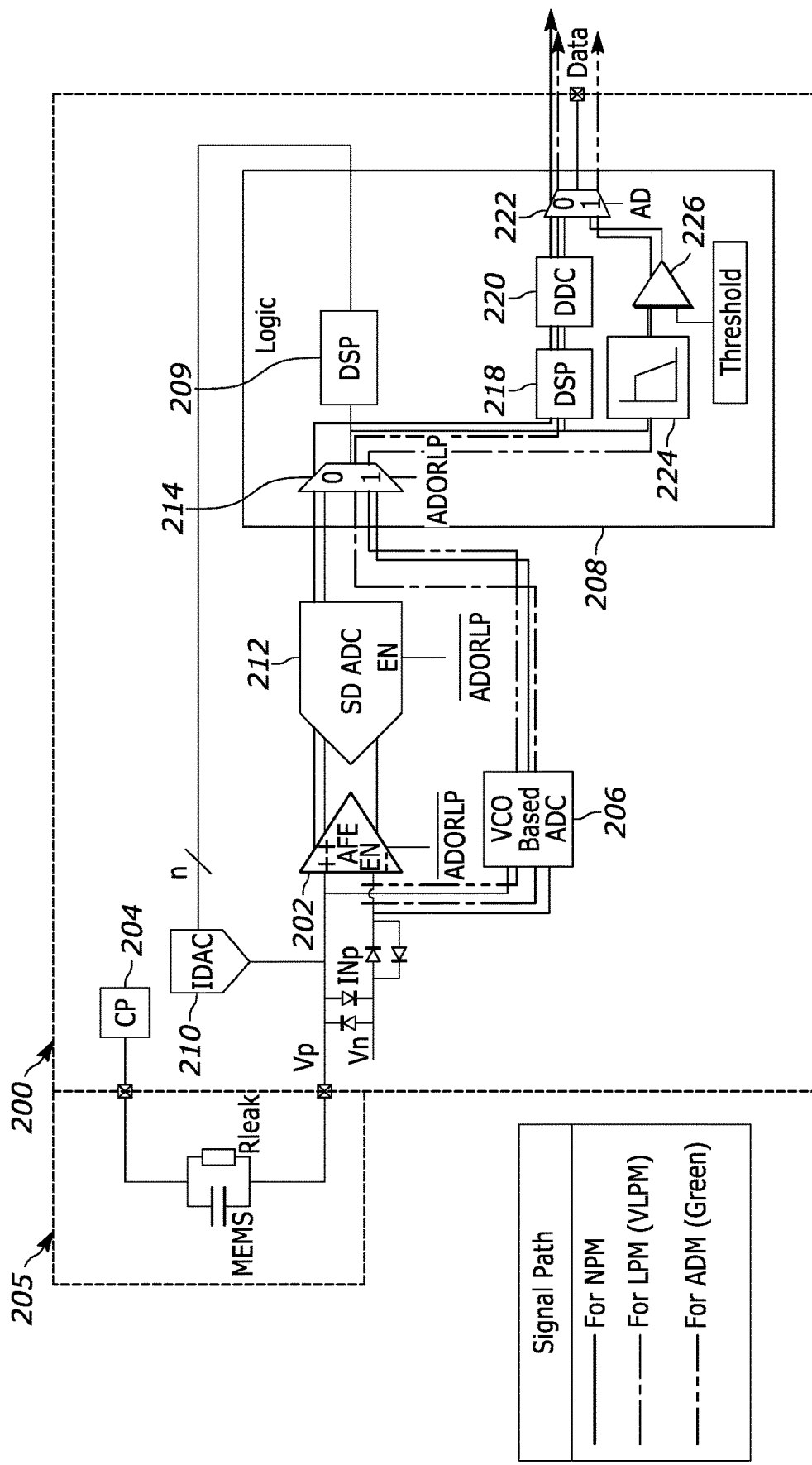
FIG. 7 illustrates forward signal-paths for representative operational modes of the digital sensor assembly of FIG. 5.

In FIGS. 5-7, a representative electrical interface circuit 200 for a digital sensor assembly comprises a DSL configured to regulate the voltage on the input of the AFE amplifier or buffer 202. The DSL comprises an n-bit iDAC 210 coupled to servo-loop logic, e.g., DSP 209, that generates PWAM signals proportional to an output of an ADC coupled to the input of the AFE amplifier or buffer 202. The interface circuit comprises a forward signal-path ADC 212 coupled to an output of the AFE amplifier or buffer 202 and the servo-loop logic. The interface circuit also comprises a low-power (auxiliary) ADC 206 coupled to an input of the AFE amplifier or buffer 202 and to the servo-loop logic. The servo-loop logic is configured to generate the PWAM signal proportional to an output of the forward-signal-path ADC 212 or an output of a low-power ADC 206, depending on an operating mode of the sensor assembly. In FIGS. 5-7, the PWAM signal is based on the signal-path ADC during normal power mode (NPM) operation, and the PWAM signal is based on the auxiliary ADC during operational modes other than normal power mode (NPM). Such other operational modes during which the PWAM is based on the auxiliary ADC include low power mode (LPM) and activity detection mode (ADM), among others. Power consumption can be reduced by disabling the forward signal-path ADC 212 when the PWAM signal is based on the low-power ADC 206. Similarly, the low-power ADC can be disabled when the PWAM signal is based on the signal-path ADC. The ADCs can be disabled by de-powering or operating in a very low power state (e.g., by de-clocking), among other power reduction schemes.

In FIGS. 5-7, the iDAC can reduce voltage changes at the interface circuit input by absorbing leakage current from the transducer element. The iDAC can also reduce shot noise in electrical circuit implementations that include back-to-back diodes coupled to the AFE amplifier or buffer. The LFRO can be tuned by controlling gain of the DSL. Compared to prior art digital servo-loops, the DSL of the interface circuit of FIGS. 5-7 regulates the voltage at the input of the AFE amplifier or buffer with substantially less power consumption. The DSL also reduces capacitive loading and noise, and improves LFRO control. Representative low-power ADCs are described further herein.

In FIGS. 5-7, the interface circuit comprises a first switch configured to select either the forward signal-path ADC 212 or the auxiliary ADC 206 to control the iDAC 210. The first switch selects the signal-path ADC 212 or the low-power ADC 206 for coupling to the PWAM signal generator, e.g., DSP 209, depending on the operating mode of the digital sensor assembly, wherein the PWAM signal is proportional to the output of the selected ADC. In FIGS. 5-7, the switch is implemented by a multiplexor 214 as part of logic 208. In FIG. 5, a logic table shows representative operational states of the interface circuit including normal power mode (NPM), a low power mode (LPM), and an activity detection mode (ADM). FIG. 6 shows a DSL signal-path when the forward signal-path ADC is selected for coupling to the servo-loop logic in NPM. FIG. 6 also show a DSL signal-path when the low-power ADC is selected for coupling to the servo-loop logic in LPM. In other implementations, the interface circuit can include alternative or additional operational modes.

In FIG. 5-7, the forward signal-path ADC can be disabled when the PWAM signal is based on an output of the auxiliary ADC. Similarly, the auxiliary ADC can be disabled when the PWAM signal is based on an output of the forward signal-path ADC. Thus configured, the DSL can regulate the voltage at the input of the AFE amplifier or buffer and provide other benefits described herein with less power consumption than prior art interface circuits.

FIG. 7 illustrates various forward signal-paths for the representative operational modes of the digital interface circuit described in FIG. 5. In normal power mode (NPM), the output of the forward signal-path ADC 212 is coupled to the output pad (DATA) of the interface circuit by logic 208. In the representative circuit, the first switch 214 couples the signal-path ADC 212 to the output pad (DATA) via a forward signal-path circuit comprising a DSP 218 and an optional digital-to-digital converter (DDC) 220. The DSP filters, decimates, and amplifies the output from the ADC selected by the first switch. The DSP filter can be a low-pass filter (LPF) for voice and other sensors. The DDC can convert the digital output from the selected ADC from one format to another (e.g., PCM to PDM, among others). The DDC may not be required in implementations where a conversion of the digital signal format is not required.

In FIGS. 5-7, a forward signal-path circuit (comprising the DSP 218) can be enabled when the sensor assembly operates in normal power mode (NPM) and low power mode (LPM). In LPM, the digital sensor assembly can provide output similar to NPM, but with reduced signal output (e.g., reduced AOP for a microphone), reduced SNR, and reduced power consumption (e.g., less than 20 µW). In LPM, the first switch couples the low-power ADC 206 to the output pad (DATA) via the forward signal-path circuit comprising the DSP 218 and the DDC 220, as shown in FIG. 7.

In FIGS. 5-7, in activity detection mode (ADM), the digital sensor assembly can be held in an ultralow power state without providing any output at the output pad (DATA) until the input signal exceeds a specified threshold. In ADM, the first switch 214 couples the auxiliary ADC 206 to the output pad (DATA) via an activity detection circuit that can detect acoustic or voice, among other activity. The activity detection circuit is coupled to the output pad (DATA) of the interface circuit. A second switch can selectably connect either the activity detection circuit or the forward signal-path circuit (comprising the DSP and optional DDC circuits) to the output pad (DATA). The DSP and DDC can be disabled or held in a low power state when the activity detection circuit is enabled. In FIGS. 5-7, the representative second switch is a multiplexer 222, and the representative activity detection circuit comprises a low pass filter 224 and a threshold detector 226. Other known or future activity detection circuits can be implemented alternatively. For example, activity detection can be performed in the digital or analog domains. In FIGS. 5-7, the forward signal-path (comprising DSP 218 and DDC 220) and the activity detection circuit (comprising filter 224 and threshold detector 226) are arranged in parallel between the first switch 214 and the second switch 222.

Generally, the low-power ADC can comprise relatively relaxed performance requirements relative to the forward signal-path ADC. Such performance requirements include reduced linearity, reduced SNR and greater process, voltage temperature (PVT)-related gain variations. In one implementation, the low-power ADC of FIGS. 4-7 can be implemented as a voltage-controlled oscillator (VCO)-based ADC. A VCO-based ADC can be very compact (i.e., require small silicon area compared to the forward signal-path ADC) since digital signals are translated in the frequency domain and processed almost immediately. Alternatively, the ADC can be a first order sigma delta ADC, among other low-power, small area ADCs.

Figure 8:
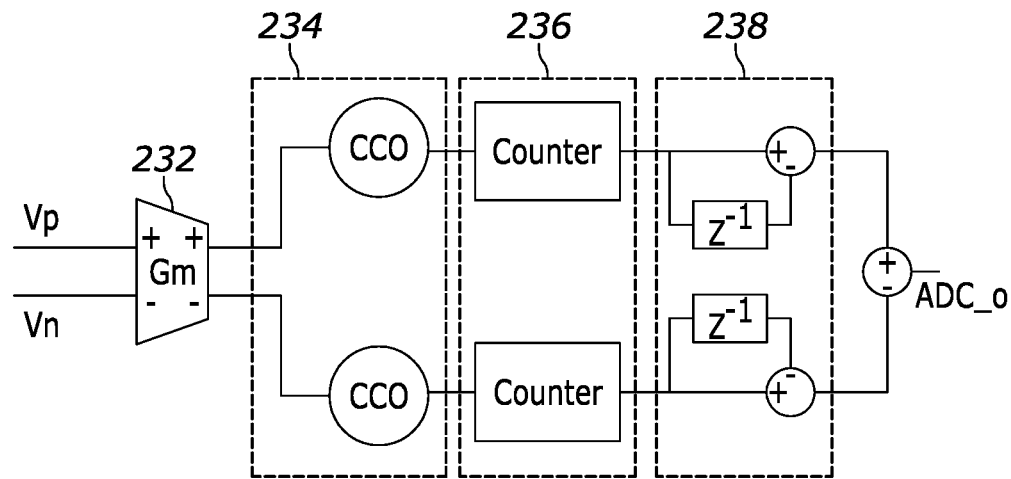
FIG. 8 is a representative voltage-controlled oscillator (VCO)-based analog-to-digital converter (ADC).
Figure 9:
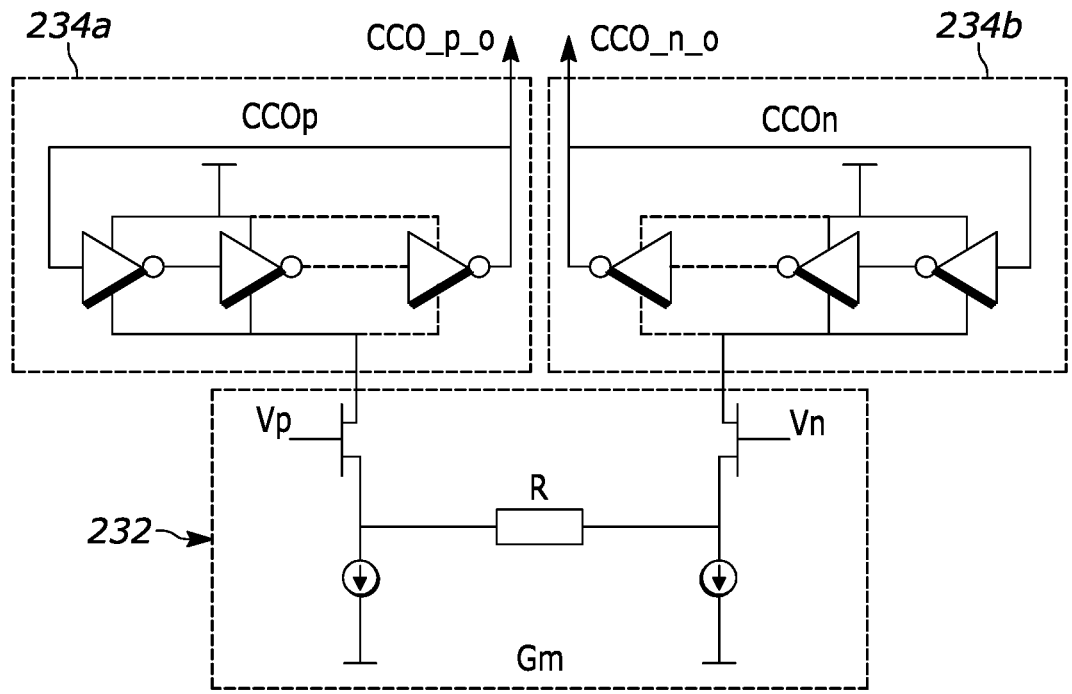
FIG. 9 is a representative implementation of transconductance and current-controlled oscillator (CCO) stages of a VCO-based ADC.

In FIG. 8, a representative VCO-based ADC 230 comprises a transconductance stage 232 having differential inputs connectable to the AFE amplifier or buffer. The transconductance stage converts the analog input voltage into a current that is used to bias a current-controlled oscillator (CCO) stage 234. The CCO generates a digital signal having a frequency proportional to the input current. The CCO stage 234 is coupled to a digital counter stage 236. Signal quantization is performed by the digital counter stage, the output of which is coupled to a differentiation stage 238. FIG. 9 is a representative digital implementation of the transconductance stage 232 and differential CCO stages 234a, 234b of the VCO-based ADC. The VCO-based ADC occupies very small area on silicon and has a very low power topology attributable in part to the reuse of the current of the transconductance stage by the CCO stage. The representative differential implementation can cancel the center frequency of the oscillator and reject common mode disturbances.

While the disclosure and what is presently considered to be the best mode thereof has been described in a manner establishing possession and enabling those of ordinary skill in the art to make and use the same, it will be understood and appreciated that there are many equivalents to the representative embodiments described herein and that myriad modifications and variations may be made thereto without departing from the scope and spirit of the invention, which is to be limited not by the embodiments described but by the appended claims and their equivalents.

What is claimed is:

1. A sensor assembly comprising:
a transducer element disposed in a housing;
an electrical interface circuit disposed in the housing and electrically coupled to a host-interface of the housing, the electrical interface circuit comprising:
  an analog front end (AFE) amplifier or buffer having an input coupled to the transducer element;
  a forward signal-path analog-to-digital converter (ADC) coupled to an output of the AFE amplifier or buffer;
  an auxiliary ADC coupled to an input of the AFE amplifier or buffer;
  a digital servo-loop (DSL) comprising an n-bit current digital-to-analog converter (iDAC) coupled to an input of the AFE amplifier or buffer and selectably coupled to the forward signal-path ADC or to the auxiliary ADC by a logic circuit configured to generate and provide a pulse width and amplitude modulated (PWAM) signal to the n-bit iDAC, the PWAM signal based on an output of the forward signal-path ADC or the auxiliary ADC coupled to the logic circuit, wherein the DSL regulates a voltage at the input of the AFE amplifier or buffer.

2. The sensor assembly of claim 1, wherein the forward signal-path ADC is disabled when the PWAM signal is based on an output of the auxiliary ADC.

3. The sensor assembly of claim 1, wherein the auxiliary ADC is disabled when the PWAM signal is based on an output of the forward signal-path ADC.

4. The sensor assembly of claim 1, the electrical interface circuit further comprising a first switch configured to selectably couple either the forward signal-path ADC or the auxiliary ADC to the logic circuit.

5. The sensor assembly of claim 1 is operable in an activity detection mode (ADM) or a low power mode (LPM) when the PWAM is based on the auxiliary ADC, wherein the forward signal-path ADC is disabled.

6. The sensor assembly of claim 4, the electrical interface circuit further comprising a forward signal-path circuit and an activity detection circuit arranged in parallel between the first switch and a second switch, wherein the second switch couples the forward signal path circuit or the activity detection circuit to the output pad for operation in LPM or ADM, respectively.

7. The sensor assembly of claim 1, wherein the transducer element is a capacitive microelectromechanical systems (MEMS) motor, and the electrical interface circuit further comprises a charge pump coupled to the MEMS motor, wherein the charge pump applies a DC bias to the MEMS motor.

8. The sensor assembly of claim 7, wherein the AFE amplifier or buffer comprises an input resistance greater than 3 T ohm and the DSL comprises a bandwidth less than 3 Hz.

9. A sensor assembly interface circuit comprising:
an analog front end (AFE) amplifier or buffer having an input connectable to a transducer element of a sensor assembly;
a digital servo-loop (DSL) comprising an n-bit current digital-to-analog converter (iDAC) coupled to the input of the AFE amplifier or buffer;
a forward signal-path analog-to-digital converter (ADC) coupled to an output of the AFE amplifier or buffer;
an auxiliary ADC coupled to the input of the AFE amplifier or buffer;
a logic circuit configured to generate and provide a pulse width and amplitude modulated (PWAM) signal to the n-bit iDAC, the PWAM signal based on an output of the forward signal-path ADC or the auxiliary ADC,
wherein the n-bit iDAC regulates a voltage at the input of the AFE amplifier or buffer based on the PWAM signal.

10. The sensor assembly interface circuit of claim 9, wherein the forward signal-path ADC is disabled when the PWAM signal is based on an output of the auxiliary ADC.

11. The sensor assembly interface circuit of claim 9 further comprising a first switch configured to select and connect either the forward signal-path ADC or the auxiliary ADC to control the logic circuit.

12. The sensor assembly interface circuit of claim 11 is operable in an activity detection mode (ADM) or a low power mode (LPM) when the PWAM is based on the auxiliary ADC, wherein the forward signal-path ADC is disabled.

13. The sensor assembly interface circuit of claim 12 further comprising a forward signal-path circuit and an activity detection circuit arranged in parallel between the first switch and a second switch, wherein the second switch couples the forward signal path circuit or the activity detection circuit to the output pad for operation in LPM or ADM, respectively.

14. The sensor assembly interface circuit of claim 9 further comprising a charge pump having an output connectable to a transducer element.

15. The sensor assembly interface circuit of claim 14, wherein the AFE amplifier or buffer comprises an input resistance greater than 3 T ohm and the DSL comprises a bandwidth less than 3 Hz.

16. A sensor assembly comprising:
a transducer element disposed in a housing;
an electrical interface circuit disposed in the housing and electrically coupled to a host-interface of the housing, the electrical interface circuit comprising:
  an analog front end (AFE) amplifier or buffer having an input coupled to the transducer element and an output coupled to an output node of the electrical interface circuit;
  a digital servo-loop (DSL) comprising an n-bit current digital-to-analog converter (iDAC) coupled to the input of the AFE amplifier or buffer, a low-power ADC coupled to the input of the AFE amplifier or buffer, and a logic circuit configured to provide a pulse width and amplitude modulation (PWAM) signal to the n-bit iDAC, the PWAM based on an output of the low-power ADC,
  wherein the DSL regulates a voltage on the input to the AFE amplifier or buffer.

17. The sensor assembly of claim 16 is an analog sensor assembly.

18. The sensor assembly of claim 16, wherein the low-power ADC is a voltage-controlled oscillator (VCO)-based ADC.

19. The sensor assembly of claim 16, wherein the DSL comprises a bandwidth less than 3 Hz.

20. The sensor assembly of claim 16, wherein the transducer element is a capacitive microelectromechanical systems (MEMS) motor, and the electrical interface circuit has an input resistance greater than 3 T ohms and further comprises a charge pump coupled to the MEMS motor, wherein the charge pump applies a DC bias to the MEMS motor.

* * * * *